(12) United States Patent
Zhang et al.

(10) Patent No.: US 11,289,615 B2
(45) Date of Patent: Mar. 29, 2022

(54) SEMICONDUCTOR STRUCTURE AND SEMICONDUCTOR DEVICE USING THE SAME

(71) Applicants: Tsinghua University, Beijing (CN); HON HAI PRECISION INDUSTRY CO., LTD., New Taipei (TW)

(72) Inventors: Jin Zhang, Beijing (CN); Yang Wei, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 142 days.

(21) Appl. No.: 16/903,171

(22) Filed: Jun. 16, 2020

(65) Prior Publication Data
US 2021/0143289 A1     May 13, 2021

(30) Foreign Application Priority Data
Nov. 8, 2019    (CN) .......................... 201911089310.4

(51) Int. Cl.
*H01L 31/0224*     (2006.01)
*H01L 31/032*      (2006.01)
*H01L 31/10*       (2006.01)

(52) U.S. Cl.
CPC ........ *H01L 31/022466* (2013.01); *H01L 31/022408* (2013.01); *H01L 31/032* (2013.01); *H01L 31/10* (2013.01)

(58) Field of Classification Search
CPC ..... H01L 31/022466; H01L 31/022408; H01L 31/032; H01L 31/10; H01L 31/0352;
(Continued)

(56) References Cited

U.S. PATENT DOCUMENTS

| | | |
|---|---|---|
| 7,719,032 B2 | 5/2010 | Maruyama et al. |
| 2018/0006227 A1 | 1/2018 | Zhang et al. |

(Continued)

FOREIGN PATENT DOCUMENTS

| | | | | |
|---|---|---|---|---|
| CA | 2372707 A1 | * | 1/2001 | ............ B82Y 10/00 |
| CN | 107564947 | | 1/2018 | |

(Continued)

*Primary Examiner* — Sitaramarao S Yechuri
(74) *Attorney, Agent, or Firm* — ScienBiziP, P.C.

(57) ABSTRACT

The present disclosure relates to a semiconductor structure. The semiconductor structure comprises a semiconductor layer, a first carbon nanotube, and a second carbon nanotube. The semiconductor layer comprises an N-type semiconductor layer and a P-type semiconductor layer stacked with each other. The first carbon nanotube is on a first surface of the semiconductor layer. The second carbon nanotube is on a second surface of the semiconductor layer. A first extending direction of the first carbon nanotube intersects with a second extending direction of the second carbon nanotube. At an intersection of the first carbon nanotube and the second carbon nanotube, and in a direction perpendicular to the semiconductor layer, a multilayer structure is formed by an overlapping region of the first carbon nanotube, the semiconductor layer, and the second carbon nanotube.

19 Claims, 6 Drawing Sheets

(58) Field of Classification Search
CPC ... H01L 31/036; H01L 31/109; H01L 31/112; H01L 31/028; H01L 29/0669; H01L 29/78
See application file for complete search history.

(56) References Cited

U.S. PATENT DOCUMENTS

| | | | |
|---|---|---|---|
| 2018/0006231 A1 | 1/2018 | Zhang et al. | |
| 2018/0006252 A1 | 1/2018 | Zhang et al. | |
| 2018/0006255 A1 | 1/2018 | Zhang et al. | |
| 2018/0342580 A1 | 11/2018 | Zhang et al. | |
| 2018/0342632 A1 | 11/2018 | Zhang et al. | |
| 2018/0342690 A1 | 11/2018 | Zhang et al. | |
| 2019/0006450 A1* | 1/2019 | Lee | H01L 29/1606 |

FOREIGN PATENT DOCUMENTS

| | | | | |
|---|---|---|---|---|
| CN | 108933166 | | 12/2018 | |
| CN | 108933182 | | 12/2018 | |
| CN | 108963003 | | 12/2018 | |
| CN | 107564979 | | 8/2019 | |
| CN | 110224022 | A * | 9/2019 | |
| JP | 2004-171903 | | 6/2004 | |
| JP | 2005-116618 | | 4/2005 | |
| JP | 2012-146982 | | 8/2012 | |
| JP | 2018-6754 | | 1/2018 | |
| JP | 2018-006755 | | 1/2018 | |
| JP | 2018-198312 | | 12/2018 | |
| JP | 2018-198313 | | 12/2018 | |
| JP | 2018-198314 | | 12/2018 | |
| TW | 201802025 | | 1/2018 | |
| TW | 201802951 | | 1/2018 | |
| TW | 201803147 | | 1/2018 | |
| TW | 201901937 | | 1/2019 | |
| TW | I656654 | | 4/2019 | |
| WO | WO-2014021522 A1 * | | 2/2014 | H01L 21/043 |

* cited by examiner

SEMICONDUCTOR STRUCTURE AND SEMICONDUCTOR DEVICE USING THE
SAME

CROSS-REFERENCE TO RELATED APPLICATIONS

This application claims all benefits accruing under 35 U.S.C. § 119 from Chinese Patent Application No. 201911089310.4, filed on Nov. 8, 2019, in the China Intellectual Property Office, the contents of which are hereby incorporated by reference. This application is also related to copending applications entitled, "LIGHT EMITTING DIODE", filed Jun. 16, 2020, Ser. No. 16/903,164. The application is also related to copending applications entitled, "SOLAR BATTERY", filed Jun. 16, 2020, Ser. No. 16/903,167. The application is also related to copending applications entitled, "PHOTOELECTRIC DETECTOR", filed Jun. 16, 2020, Ser. No. 16/903,161.

FIELD

The present disclosure relates to a semiconductor structure and a semiconductor device using the same, especially relates to a nano-sized semiconductor structure and a nano-sized semiconductor device.

BACKGROUND

Properties of vertically heterogeneous structures formed by vertical stacking two-dimensional semiconductor materials with different properties can be controlled manually. The vertical heterogeneous structures exhibit great potentials in nano-electronics and nano-optoelectronics due to a new dimension is added in a vertical direction. Compared with lateral heterogeneous structures, the vertical heterogeneous structures have higher photoelectric conversion efficiency due to their thin atom structure. Further, optoelectronic devices using the vertical heterogeneous structure have high signal-to-noise ratio and low power consumption.

However, an overlapping area between a two-dimensional p-n junction semiconductor layer and electrodes of conventional vertical heterogeneous structures is in micron-size. Therefore, semiconductor structures using conventional vertical heterogeneous structures cannot reach nanoscale, resulting a limited applications of semiconductor structures and semiconductor devices using the vertical heterogeneous structures. Further, heterojunctions of conventional semiconductor structures can only realize one of a p-p junction, a p-n junction, and an n-n junction, and can not switch between the p-p junction, the p-n junction, and the n-n junction. Therefore, semiconductor devices using conventional semiconductor structures can only operate in one mode.

BRIEF DESCRIPTION OF THE DRAWINGS

Implementations of the present technology will now be described, by way of example only, with reference to the attached figures, wherein.

DETAILED DESCRIPTION

Figure 1:
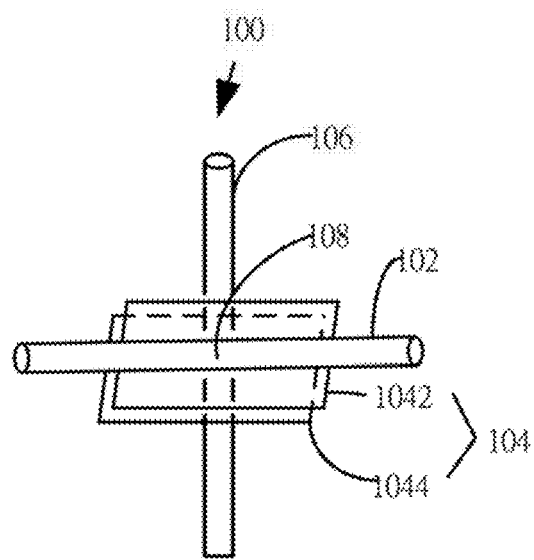
FIG. 1 is a structure schematic view of one embodiment of a semiconductor structure.

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts have been exaggerated to illustrate details and features of the present disclosure better.

Several definitions that apply throughout this disclosure will now be presented.

The term "substantially" is defined to be essentially conforming to the particular dimension, shape, or other feature which is described, such that the component need not be exactly or strictly conforming to such a feature. The term "comprise," when utilized, means "include, but not necessarily limited to"; it specifically indicates open-ended inclusion or membership in the so-described combination, group, series, and the like.

Figure 2:
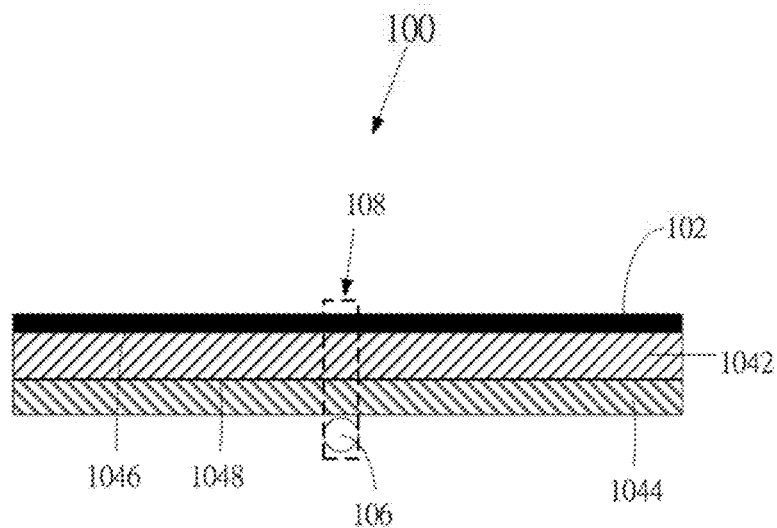
FIG. 2 is a side structure schematic view of the semiconductor structure of FIG. 1.

Referring to FIG. 1 and FIG. 2, one embodiment is described in relation to a semiconductor structure 100. The semiconductor structure 100 comprises a first carbon nanotube 102, a semiconductor layer 104, and a second carbon nanotube 106. The semiconductor layer 104 is sandwiched between the first carbon nanotube 102 and the second carbon nanotube 106. The semiconductor layer 104 defines a first surface 1046 and a second surface 1048 opposite to the first surface 1046. The first carbon nanotube 102 is located on the first surface 1046 and is in direct contact with the first surface 1046. The second carbon nanotube 106 is located on the second surface 1048 and is in direct contact with the second surface 1048. The semiconductor layer 104 comprises an N-type semiconductor layer 1042 and a P-type semiconductor layer 1044, and the N-type semiconductor layer 1042 and the P-type semiconductor layer 1044 are stacked with each other. Each of the N-type semiconductor layer 1042 and the P-type semiconductor layer 1044 is a two-dimensional material. The two-dimensional material refers to a material in which electrons can perform plane movement freely only on a nanometer scale (1-100 nm) in two dimensions, such as nanofilms, superlattices, quantum wells, etc. A first extending direction of the first carbon nanotube 102 intersects with a second extending direction of the second carbon nanotube 106.

In one embodiment, only a single first carbon nanotube 102 is located on the first surface 1046 of the semiconductor layer 104, that is, the number of the first carbon nanotube 102 is only one. The first carbon nanotube 102 is a metallic carbon nanotube. The first carbon nanotube 102 can be a single-walled carbon nanotube, a double-walled carbon nanotube, or a multi-walled carbon nanotube. In one embodiment, a diameter of the first carbon nanotube 102 ranges from 0.5 nanometers to 100 nanometers. In one embodiment, the diameter of the first carbon nanotube 102 ranges from 0.5 nanometers to 10 nanometers. In one embodiment, the first carbon nanotube 102 is the single-walled carbon nanotube, and the diameter of the first carbon nanotube 102 ranges from 0.5 nanometers to 2.0 nanometers. In one embodiment, the diameter of the first carbon nanotube 102 is 1.0 nanometer.

In one embodiment, the first carbon nanotube 102 is an inner shell carbon nanotube. The inner shell carbon nanotube refers to the innermost carbon nanotube of the double-walled carbon nanotube or the multi-walled carbon nanotube. The inner shell carbon nanotubes can be pulled from an ultra-long double-walled carbon nanotube or an ultra-long multi-walled carbon nanotube. A length of the ultra-long double-walled carbon nanotube or the ultra-long multi-walled carbon nanotube is larger than 150 micrometers. In one embodiment, the length of the ultra-long double-walled carbon nanotube or the ultra-long multi-walled carbon nanotube ranges from 150 micrometers to 300 micrometers. A method of obtaining the inner shell carbon nanotube comprises stretching two ends of the ultra-long double-walled carbon nanotube or the ultra-long multi-walled carbon nanotube, where outer walls of the ultra-long double-walled carbon nanotubes or the ultra-long multi-walled carbon nanotubes are sheared off in the middle part under tension, and the innermost wall of carbon nanotube remains in the middle part of the ultra-long double-walled carbon nanotube or the ultra-long multi-walled carbon nanotube, and selecting a section of the innermost wall of carbon nanotube to obtain the inner shell carbon nanotube. The inner shell carbon nanotube provides a clean surface with no impurities on a surface of the inner shell carbon nanotube, therefore, the first carbon nanotube 102 can be in good contact with the semiconductor layer 104. The first carbon nanotube 102 is not limited to the inner shell carbon nanotube, the first carbon nanotube 102 can also be other single-walled carbon nanotubes, double-walled carbon nanotubes, or multi-walled carbon nanotubes.

The N-type semiconductor layer 1042 and the P-type semiconductor layer 1044 are stacked with each other. A p-n junction is formed by the N-type semiconductor layer 1042 and the P-type semiconductor layer 1044 in a direction perpendicular to the semiconductor layer 104. The semiconductor layer 104 is a two-dimensional layered structure having a thickness of nanometer size. When the thickness of the semiconductor layer 104 is too large, such as, larger than 200 nanometers, a current modulation effect of the semiconductor structure 100 is limited. In one embodiment, the thickness of the semiconductor layer 104 ranges from 1.0 nanometer to 200 nanometers. In one embodiment, a thickness of the N-type semiconductor layer 1042 ranges from about 0.5 nanometers to about 100 nanometers. In one embodiment, a thickness of the N-type semiconductor layer 1042 ranges from 0.5 nanometers to 50 nanometers. In one embodiment, a thickness of the P-type semiconductor layer 1044 ranges from 0.5 nanometers to 100 nanometers. In one embodiment, a thickness of the P-type semiconductor layer 1044 ranges from 0.5 nanometers to 50 nanometers. In one embodiment, the N-type semiconductor layer 1042 is in direct contact with the first carbon nanotube 102, and the P-type semiconductor layer 1044 is in direct contact with the second carbon nanotube 106. In some other embodiments, the N-type semiconductor layer 1042 is in direct contact with the second carbon nanotube 106, and the P-type semiconductor layer 1044 is in direct contact with the first carbon nanotube 102.

A material of the P-type semiconductor layer 1044 and a material of the N-type semiconductor layer 1042 can be an inorganic compound semiconductor, an element semiconductor, an organic semiconductor material, or a material doped with the inorganic compound semiconductor, the element semiconductor, or the organic semiconductor material. In one embodiment, the material of the N-type semiconductor layer 1042 is molybdenum disulfide ($MoS_2$), and the thickness of the N-type semiconductor layer 1042 is 16 nanometers; and the material the P-type semiconductor layer 1044 is tungsten diselenide ($WSe_2$), and the thickness of the P-type semiconductor layer 1044 is 14 nanometers. In one embodiment, the material of the N-type semiconductor layer 1042 is $MoS_2$, and the thickness of the N-type semiconductor layer 1042 is 7.6 nanometers; and the material the P-type semiconductor layer 1044 is $WSe_2$, and the thickness of the P-type semiconductor layer 1044 is 76 nanometers.

In one embodiment, only a single second carbon nanotube 106 is located on the second surface 1048 of the semiconductor layer 104, that is, the number of the second carbon nanotube 106 is only one. The second carbon nanotube 106 is a metallic carbon nanotube. The second carbon nanotube can be a single-walled carbon nanotube, a double-walled carbon nanotube, or a multi-walled carbon nanotube. In one embodiment, a diameter of the second carbon nanotube 106 ranges from 0.5 nanometers to 100 nanometers. In one embodiment, the diameter of the second carbon nanotube 106 ranges from 0.5 nanometers to 10 nanometers. In another embodiment, the second carbon nanotube 106 is a single-walled carbon nanotube, and the diameter of the second carbon nanotube 106 ranges from 0.5 nanometers to 2.0 nanometers. In one embodiment, the diameter of the second carbon nanotube 106 is 1.0 nanometer. In one embodiment, the second carbon nanotube 106 is the same as the first carbon nanotube 102, and the second carbon nanotube 106 is the inner shell carbon nanotube. The inner shell carbon nanotubes can be pulled out from an ultra-long double-walled carbon nanotube or an ultra-long multi-walled carbon nanotube. A length of the ultra-long double-walled carbon nanotube or the ultra-long multi-walled carbon nanotube is larger than 150 micrometers. In one embodiment, the length of the ultra-long double-walled carbon nanotube or the ultra-long multi-walled carbon nanotube ranges from 150 micrometers to 300 micrometers. The inner shell carbon nanotube provides a clean surface with no impurities on a surface of the inner shell carbon nanotube, therefore, the second carbon nanotube 106 can be in good contact with the semiconductor layer 104. The second carbon nanotube 106 is not limited to the inner shell carbon nanotube, the second carbon nanotube 106 can also be other single-walled carbon nanotubes, double-walled carbon nanotubes, or multi-walled carbon nanotubes.

The first extending direction of the first carbon nanotube 102 intersects with the second extending direction of the second carbon nanotube 106 refers to that an angle is formed between the first extending direction and the second extending direction. The angle is larger than 0 degree and less than or equal to 90 degrees. In one embodiment, the first extending direction is perpendicular to the second extending direction, that is, the angle is 90 degrees.

Referring to FIG. 2, at an intersection of the first carbon nanotube 102 and the second carbon nanotube 106, and in a direction perpendicular to the semiconductor layer 104, a multilayer structure 108 is formed by an overlapping region of the first carbon nanotube 102, the semiconductor layer 104, and the second carbon nanotube 106. The multilayer structure 108 defines a lateral cross section and a longitudinal section. The lateral cross section is a cross section parallel to a major surface of the semiconductor layer 104. The longitudinal section is a section perpendicular to the major surface of the semiconductor layer 104. Since a size of the first carbon nanotube 102 and a size of the second carbon nanotube 106 are smaller relative to the semiconductor layer 104, an area of the lateral cross section is determined by the diameter of the first carbon nanotube 102 or the second carbon nanotube 106, the area of the lateral cross section of the multilayer structure 108 is also in nanometer size. An area of the longitudinal section is determined by the diameter of the first carbon nanotube 102, the diameter of the second carbon nanotube 106 and the thickness of the semiconductor layer 104. The diameter of the first carbon nanotube 102 and the diameter of the second carbon nanotube 106 are both in nanometers, and the thickness of the semiconductor layer 104 is also in nanometers; therefore, the area of the longitudinal section of the multilayer structure 108 is also in nanometers. The multilayer structure 108 is a nano-dimensional structure. In one embodiment, the area of the lateral cross section of the multilayer structure 108 ranges from 0.25 square nanometers to 1000 square nanometers. In one embodiment, the area of the lateral cross section of the multilayer structure 108 ranges from 1.0 square nanometer to 100 square nanometers. Therefore, a vertical point p-n junction can be formed by at the intersection of the first carbon nanotube 102 and the second carbon nanotube 106 in the overlapping region. The vertical point p-n junction is van der Waals heterojunction. A nano-heterogeneous structure is formed by the first carbon nanotube 102, the semiconductor layer 104, and the second carbon nanotube 106 at the multilayer structure 108 in a direction perpendicular to the semiconductor layer 104.

In use of the semiconductor structure 100, the first carbon nanotube 102 and the second carbon nanotube 106 are used as two electrodes located on two opposite surfaces of the semiconductor layer 104. When a source-drain bias voltage is applied to the first carbon nanotube 102 and the second carbon nanotube 106, a current flows along the cross-sectional surface of the multilayer structure 108. A working part of the semiconductor structure 100 is the multilayer structure 108. As such, a size of the semiconductor structure 100 is larger than or equal to the multilayer structure 108. As such, the semiconductor structure 100 is in nanoscale. The semiconductor structure 100 has low energy consumption, a high spatial resolution, and a high integrity.

The semiconductor structure of the present disclosure has following characters. First, the semiconductor structure is formed by two intersecting carbon nanotubes sandwiching a two-dimensional semiconductor layer containing vertical p-n junction. The first carbon nanotube and the second carbon nanotube are used as electrodes. Since electric field shielding of carbon nanotubes is weak, a leakage current of the vertical point p-n structure is low, and the doping of nanomaterials in carbon nanotubes and heterojunctions can be easily regulated by the electric field, a doped state of nanomaterials in carbon nanotubes and p-n junctions is changed under electric field modulation; therefore, when the semiconductor structure is used on a semiconductor device, the heterojunction formed in the semiconductor layer of the semiconductor structure can be switched between a p-p junction, a p-n junction and an n-n junction under electric field modulation, and the semiconductor device using the semiconductor structure can work in three different modes. Second, the semiconductor structure is formed by two intersecting carbon nanotubes sandwiching the two-dimensional semiconductor layer containing vertical p-n junction. Since the diameters of the two carbon nanotubes are in nanometer size, at the intersection of the two carbon nanotubes, a nano-sized vertical point p-n junction is formed at the overlapping region of the two carbon nanotubes and the semiconductor layer. The size of the semiconductor structure only needs to be larger than or equal to the volume of the overlapping area. Therefore, the size of the semiconductor structure can be reduced to a nano-size; the nano-sized semiconductor structure will have important applications in the fields of future nanoelectronics and nano-optoelectronics. Third, the vertical point p-n heterojunction in the semiconductor structure is formed by vertically stacking different types of semiconductor layers, compared with the lateral p-n heterojunction; the semiconductor structure of the present invention has shorter diffusion distance, lower leakage current, and higher light-induced carrier extraction efficiency. Fourth, the built-in potential of the semiconductor structure is large, so the semiconductor device using the semiconductor structure of the present invention is excellent in terms of photodetector power consumption and zero bias signal-to-noise ratios. Fifth, each of the two electrodes of the light emitting diode is a carbon nanotube. Since absorption or reflection of light by carbon nanotubes can be neglectable and carbon nanotubes have excellent light transmission, a photoelectric detector using the semiconductor structure of the present disclosure has high photoelectric detection efficiency.

Figure 3:
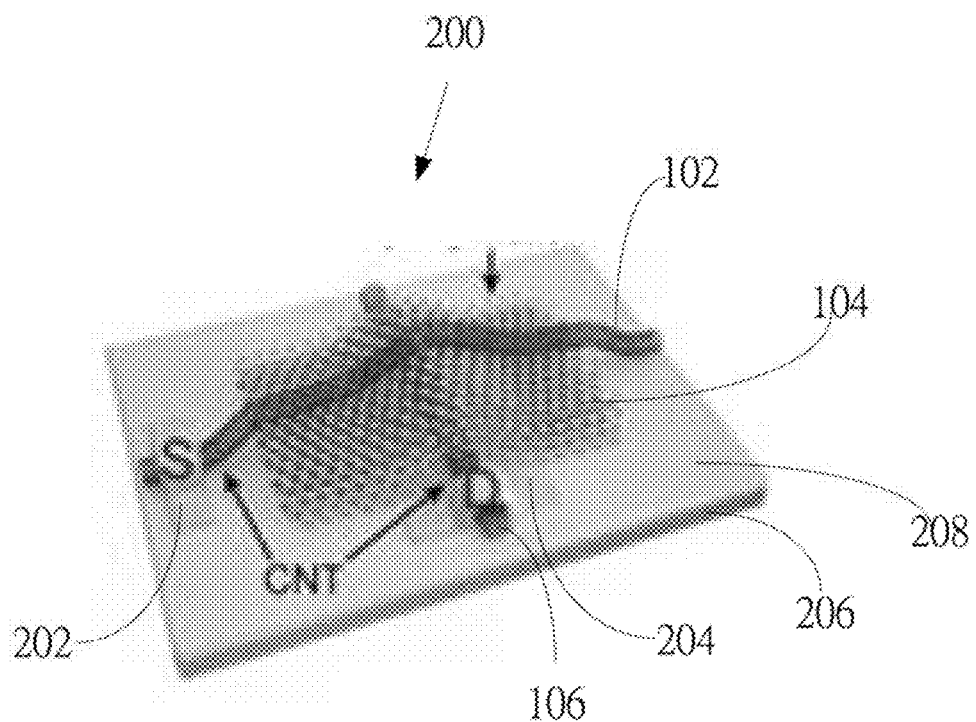
FIG. 3 is a structure schematic view of one embodiment of a semiconductor device using the semiconductor structure of FIG. 1.
Figure 4:
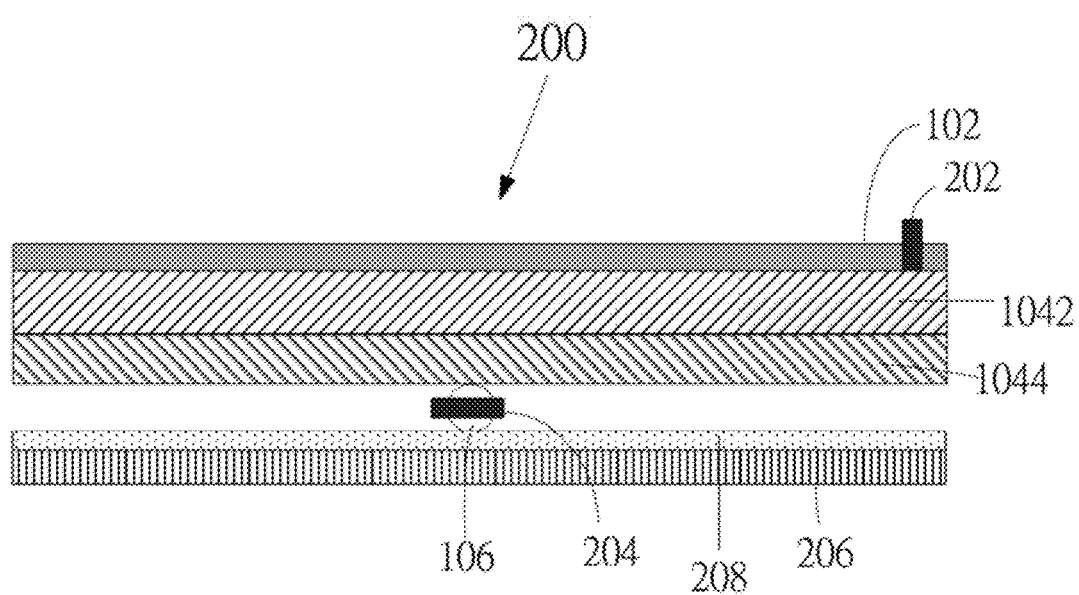
FIG. 4 is a side structure schematic view of the semiconductor device in FIG. 3.

Referring to FIG. 3 and FIG. 4, a semiconductor device 200 according to one embodiment is provided. The semiconductor device 200 comprises a first electrode 202, a second electrode 204, a semiconductor structure, and a third electrode 206. The semiconductor structure is electrically connected to the first electrode 202 and the second electrode 204. The third electrode 206 is insulated from the semiconductor structure, the first electrode 202 and the second electrode 204 through an insulating layer 208. Characteristics of the semiconductor structure are the same as that of the semiconductor structure 100 discussed before.

In the semiconductor device 200, the third electrode 206 and the insulating layer 208 are stacked with each other, and the semiconductor structure is located on a surface of the insulating layer 208, the insulating layer 208 is located between the third electrode 206 and the semiconductor structure. In the semiconductor structure, the second carbon nanotube 106 is directly disposed on the surface of the insulating layer 208, the semiconductor layer 104 is disposed above the second carbon nanotube 106, the second carbon nanotube 106 is disposed between the semiconductor layer 104 and the insulating layer 208, and the first carbon nanotube 102 is located on a surface of the semiconductor layer 104 away from the insulating layer 208.

The first electrode 202 and the second electrode 204 are made of conductive material, such as metal, Indium Tin Oxides (ITO), Antimony Tin Oxide (ATO), conductive silver paste, carbon nanotubes or any other suitable conductive materials. The metal can be aluminum, copper, tungsten, molybdenum, gold, titanium, palladium or any combination of alloys. In one embodiment, the first electrode 202 and the second electrode 204 are both conductive films. A thickness of the conductive film ranges from 2 microns to 100 micrometers. In one embodiment, the first electrode 202 and the second electrode 204 are metallic composite structures formed by compounding metal Au on a surface of metal Ti. A thickness of the metal Ti is 5.0 nanometers. A thickness of the metal Au is 60 nanometers. In one embodiment, the first electrode 202 is located at one end of the first carbon nanotube 102 and adhered to a surface of the first carbon nanotube 102, and the second electrode 204 is located at one end of the second carbon nanotube 106 and adhered to a surface of the second carbon nanotube 106

The third electrode 206 is made of a conductive material. The conductive material may be selected from the group consisting of metal, ITO, ATO, conductive silver paste, conductive polymer, and conductive carbon nanotube. The metallic material may be aluminum, copper, tungsten, molybdenum, gold, titanium, palladium or any combination of alloys. In one embodiment, the third electrode 206 is a layered structure. The insulating layer 208 is located on and in direct contact with the third electrode 206. The first electrode 202, the second electrode 204, and the semiconductor structure are located on the insulating layer 208. The first electrode 202, the second electrode 204, and the semiconductor device 200 are supported by the third electrode 206 and the insulating layer 208. In one embodiment, the second carbon nanotube 106 is directly located on a surface of the insulating layer 208 away from the third electrode 206. The second carbon nanotube 106 is close to the third electrode 206, and the first carbon nanotube 102 is far from the third electrode 206; a shielding effect between the semiconductor layer 104 and the third electrode 206 is not generated by the first carbon nanotube 102. Therefore, in used, the semiconductor structure can be controlled by the third electrode 206.

A material of the insulating layer 208 is an insulating material. The material of the insulating layer 208 can be hard materials such as silicon nitride or silicon oxide. The material of the insulating layer 208 can also be flexible materials such as benzocyclobutene (BCB), polyester or acrylic resin. A thickness of the insulating layer 208 can be ranged from 2 nanometers to 100 micrometers. In one embodiment, the material of the insulating layer 208 is silicon nitride, and the thickness of the insulating layer 208 is 50 nanometers.

In one embodiment, the semiconductor device 200 is a transistor. The first electrode 202 is grounded as a source electrode, the second electrode 204 is a drain electrode, and the third electrode 206 is a grid electrode. The second carbon nanotube 106 is directly disposed on the insulating layer 208 and is used as a back electrode, and the second carbon nanotube 106 is separated from the third electrode 206 as the grid electrode by only one insulating layer 208; since the carbon nanotubes have special properties, the conduction of the semiconductor structure can be adjusted by the grid electrode, and the semiconductor structure can exhibit adjustable output characteristics. In one embodiment, the second carbon nanotube 106 is located on a surface of the P-type semiconductor layer 1044, and the first carbon nanotube 102 is located on a surface of the N-type semiconductor layer 1042; the P-type semiconductor layer 1044 is an $MoS_2$ layer with a thickness of 16 nanometers, and the N-type semiconductor layer 1042 is a $WSe_2$ layer with a thickness of 14 nanometers.

Figure 5:
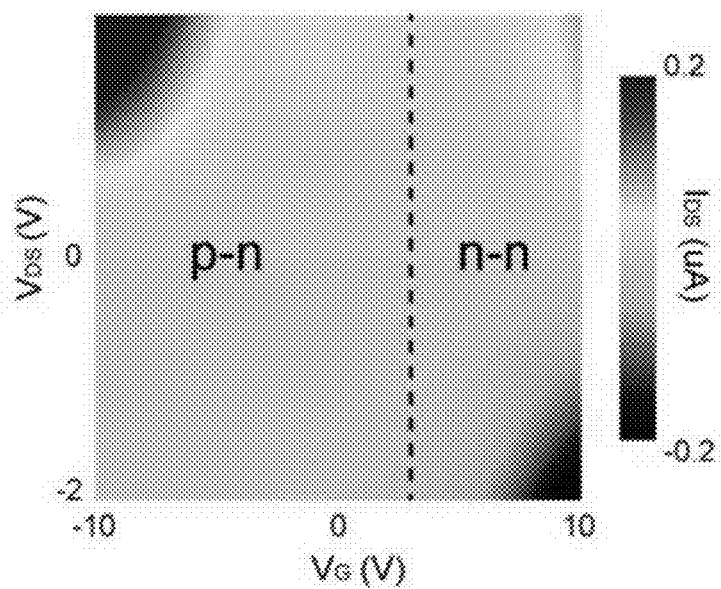
FIG. 5 is a diagram of a change in current flow through the semiconductor structure vs a source-drain bias voltage and a grid voltage of the semiconductor device in FIG. 3.
Figure 6:
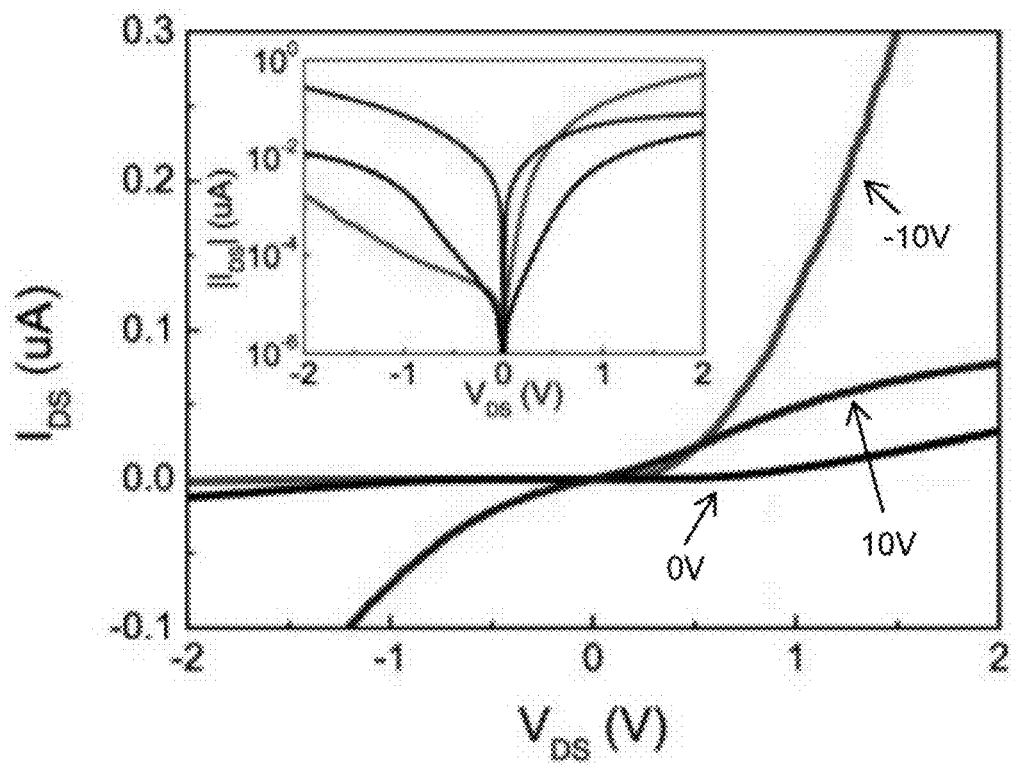
FIG. 6 is output characteristics of the semiconductor device of FIG. 2 at grid voltages of −10V, 0V, and 10V.

Referring to FIG. 5, when the grid voltage changes from negative to positive, the semiconductor structure in the semiconductor device 200 changes from a p-n junction to an n-n junction. FIG. 6 is a diagram of the current of the semiconductor device 200 when the grid voltage changes from −10V to 10V. It can be seen that the current of the semiconductor structure of the semiconductor device 200 is controlled by the grid voltage, which is because the change in the grid voltage can cause a change in the doping of the nanomaterial.

It is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

Depending on the embodiment, certain of the steps of a method described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A semiconductor structure comprising:
    a semiconductor layer defining a first surface and a second surface opposite to the first surface, wherein the semiconductor layer comprises an N-type semiconductor layer and a P-type semiconductor layer stacked with each other, and each of the N-type semiconductor layer and the P-type semiconductor layer is a two-dimensional material;
    a first carbon nanotube on the first surface and in direct contact with the first surface, and extending in a first extending direction; and
    a second carbon nanotube on the second surface and in direct contact with the second surface, and extending in a second extending direction, wherein the second extending direction intersects with the first extending direction, and a multilayer structure is formed by an overlapping region of the first carbon nanotube, the semiconductor layer, and the second carbon nanotube, and each of the first carbon nanotube and the second carbon nanotube is an inner shell carbon nanotube, and the inner shell carbon nanotube is an innermost wall of a double-walled carbon nanotube or an innermost wall of a multi-walled carbon nanotube.

2. The semiconductor structure of claim 1, wherein the overlapping region comprises a vertical point p-n junction.

3. The semiconductor structure of claim 2, wherein the vertical point p-n junction is a van der Waals heterojunction.

4. The semiconductor structure of claim 1, wherein only one first carbon nanotube is on the first surface of the semiconductor layer.

5. The semiconductor structure of claim 1, wherein only one second carbon nanotube is on the second surface of the semiconductor layer.

6. The semiconductor structure of claim 1, wherein the inner shell carbon nanotube is pulled from an ultra-long double-walled carbon nanotube or an ultra-long multi-walled carbon nanotube, and a length of the ultra-long double-walled carbon nanotube or a length of the ultra-long multi-walled carbon nanotube is larger than 150 micrometers.

7. The semiconductor structure of claim 6, wherein the length of the ultra-long double-walled carbon nanotube or the length of the ultra-long multi-walled carbon nanotube ranges from 150 micrometers to 300 micrometers.

8. The semiconductor structure of claim 1, wherein a diameter of the first carbon nanotube ranges from 0.5 nanometers to 10 nanometers.

9. The semiconductor structure of claim 1, wherein a diameter of the second carbon nanotube ranges from 0.5 nanometers to 10 nanometers.

10. The photoelectric detector of claim 1, wherein a thickness of the semiconductor layer ranges from 1.0 nanometer to 200 nanometers.

11. The semiconductor structure of claim 1, wherein a thickness of the N-type semiconductor layer ranges from 0.5 nanometers to 50 nanometers, and a thickness of the P-type semiconductor layer ranges from 0.5 nanometers to 50 nanometers.

12. The semiconductor structure of claim 1, wherein a material of the N-type semiconductor layer is molybdenum disulfide, and a material of the P-type semiconductor layer is tungsten diselenide.

13. The semiconductor structure of claim 1, wherein the first extending direction is perpendicular to the second extending direction.

14. The semiconductor structure of claim 1, wherein each of the first carbon nanotube and the second carbon nanotube is a metallic carbon nanotube.

15. The semiconductor structure of claim 1, wherein the multilayer structure defines a lateral cross section, and the lateral cross section is a cross section parallel to a major surface of the semiconductor layer; and an area of the lateral cross section ranges from 1.0 square nanometer to 100 square nanometers.

16. A semiconductor device comprising:
a first electrode, a second electrode, a semiconductor structure, a third electrode and an insulating layer, wherein the semiconductor structure is electrically connected to the first electrode and the second electrode; and the third electrode is insulated from the semiconductor structure, the first electrode and the second electrode through the insulating layer; and the semiconductor structure comprises:
a semiconductor layer defining a first surface and a second surface opposite to the first surface, wherein the semiconductor layer comprises an N-type semiconductor layer and a P-type semiconductor layer stacked with each other, and each of the N-type semiconductor layer and the P-type semiconductor layer is a two-dimensional material;
a first carbon nanotube on the first surface and in direct contact with the first surface, and electrically connected to the first electrode, wherein the first carbon nanotube extends in a first extending direction; and
a second carbon nanotube on the second surface and in direct contact with the second surface, and electrically connected to the second electrode, wherein the second carbon nanotube extends in a second extending direction, and the second extending direction intersects with the first extending direction,
wherein a multilayer structure is formed by an overlapping region of the first carbon nanotube, the semiconductor layer, and the second carbon nanotube, and each of the first carbon nanotube and the second carbon nanotube is an inner shell carbon nanotube, and the inner shell carbon nanotube is an innermost wall of a double-walled carbon nanotube or an innermost wall of a multi-walled carbon nanotube.

17. The semiconductor device of claim 16, wherein the second carbon nanotube is on a surface of the P-type semiconductor layer, and the first carbon nanotube is on a surface of the N-type semiconductor layer.

18. The semiconductor device of claim 16, wherein each of the first electrode and the second electrode is a metallic composite structure of metal gold (Au) compounded on a surface of metal titanium (Ti).

19. The semiconductor device of claim 18, wherein a thickness of the metal Ti is approximately 5.0 nanometers, and a thickness of the metal Au is approximately 60 nanometers.

* * * * *